United States Patent [19]

Hynecek

[11] Patent Number: 4,750,980

[45] Date of Patent: Jun. 14, 1988

[54] PROCESS FOR ETCHING TIN OXIDE

[75] Inventor: Jaroslav Hynecek, Richardson, Tex.

[73] Assignee: Texas Instruments Incorporated, Dallas, Tex.

[21] Appl. No.: 928,440

[22] Filed: Nov. 7, 1986

[51] Int. Cl.$^4$ .................. C23C 14/34; B44C 1/22
[52] U.S. Cl. .............. 204/192.35; 156/643; 156/646; 156/653; 427/126.3
[58] Field of Search .......... 204/192.29, 192.3, 192.32, 204/192.35; 156/643, 646, 653, 656, 667; 252/79.1; 427/126.3

[56] References Cited

U.S. PATENT DOCUMENTS

| | | | |
|---|---|---|---|
| 4,380,488 | 4/1983 | Reichelderfer et al. | 156/646 X |
| 4,496,419 | 1/1985 | Nulman et al. | 156/646 X |
| 4,544,444 | 10/1985 | Chang | 156/667 X |
| 4,592,800 | 6/1986 | Landau et al. | 156/646 |
| 4,613,400 | 9/1986 | Tam et al. | 156/643 |
| 4,618,398 | 10/1986 | Nawata et al. | 156/646 X |
| 4,665,008 | 5/1987 | Nishiura et al. | 156/667 X |

Primary Examiner—John F. Niebling
Assistant Examiner—Nam X. Nguyen
Attorney, Agent, or Firm—Carlton H. Hoel; Leo N. Heiting; Melvin Sharp

[57] ABSTRACT

A composition for a plasma etch of tin oxide is disclosed that comprises a major proportion of chloroform gas and a minor proportion of a polymer suppressant gas such as boron trichloride or chlorine. A novel reactor is provided in connection with the etchant of the invention that has refractory components and a floating electrode designed to reduce polymer formation.

21 Claims, 1 Drawing Sheet

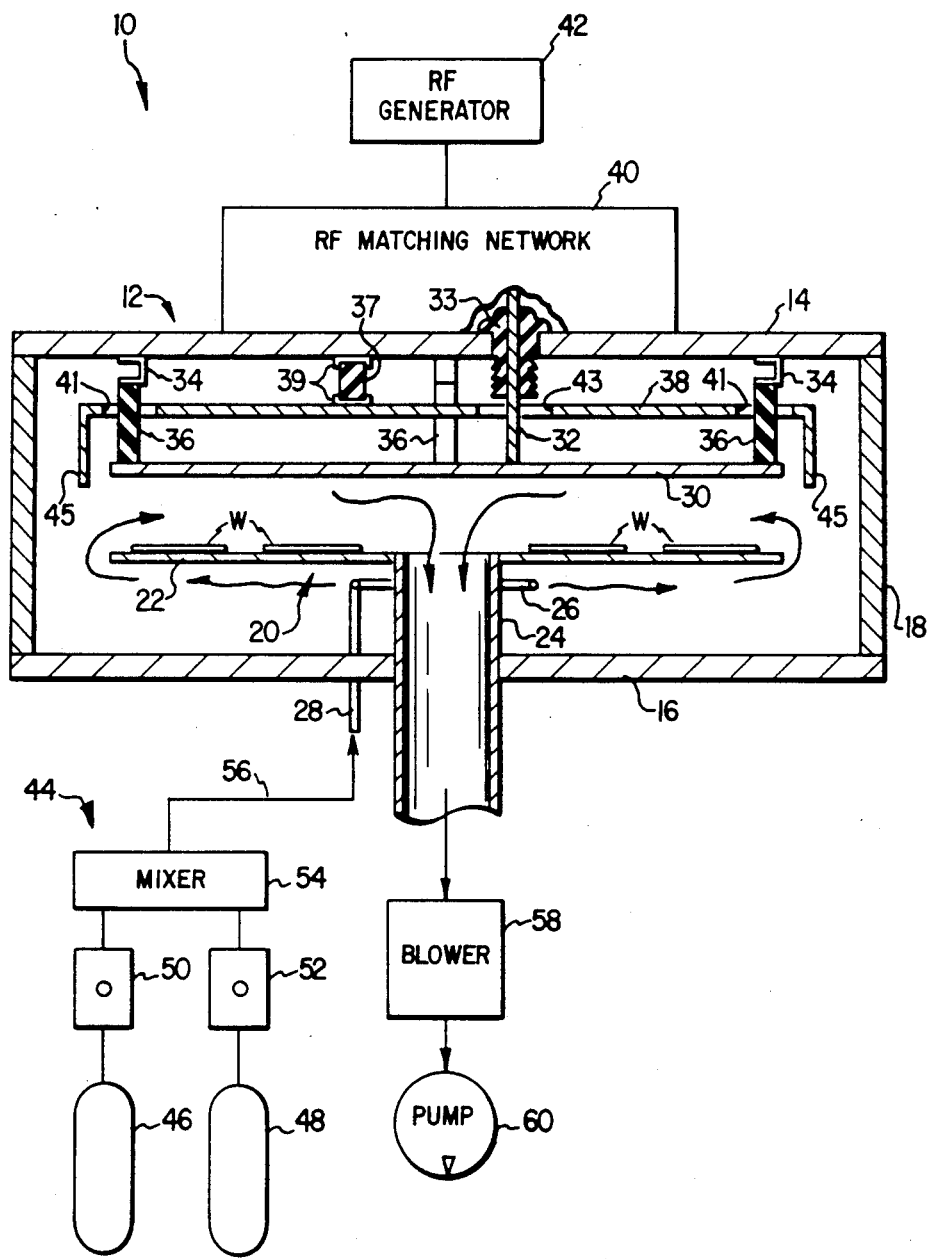

PROCESS FOR ETCHING TIN OXIDE

TECHNICAL FIELD OF THE INVENTION

This invention relates in general to the field of fabricating semiconductor devices, and more particularly relates to methods and apparatus for etching tin oxide.

BACKGROUND OF THE INVENTION

In recent years, tin oxide has been introduced into the field of semiconductor integrated circuits because of its conductive properties (when appropriately doped) and relative transparency. In particular, tin oxide has been used in fabricating certain charge coupled device (CCD) imagers. In these imagers, tin oxide forms conductive electrodes overlying clocked wells formed in a semiconductor substrate. The electrodes are conventionally formed by depositing a sheet of tin oxide on a gate oxide layer, and then etching the tin oxide sheet to form a plurality of electrodes.

Tin oxide is however a very refractory material and poses special problems in forming microelectronic circuit components with it. Certain wet etches have been reported in the art as successfully etching tin oxide. Among these is an etch using hydrochloric acid and zinc dust. This etch is however insufficiently reliable and does not produce sufficient definition to use in defining tin oxide electrodes in modern-day CCD imagers. Another wet etch known in the art employs hydrogen iodide in an aqueous solution in concentrations ranging from 45 to 51 percent. This etch often produces cracked tin oxide layers and attacks the tin oxide film along its grain boundaries. Chloroform or other carbon-based gases have also not been heretofore satisfactory as plasma reactor etchants because they have tended to deposit a yellow, carbon-based polymer on the reactor apparatus.

A need has therefore arisen in the industry for a tin oxide etching process that can reliably produce tin oxide CCD imagers and other tin oxide semiconductor devices of high quality and resolution.

SUMMARY OF THE INVENTION

A preferred etchant composition according to the invention comprises a gas made up of a major proportion of chloroform and a minor proportion of a polymer suppressant selected from boron trichloride, chlorine or mixtures thereof. The etchant of the invention is preferably used in a novel plasma reactor that has an interior surface faced with refractory materials such as aluminum (which develops an aluminum oxide film), quartz or glass. The preferred reactor of the invention includes a floating electrode in order to suppress the formation of a yellow polymer caused by carbon-based etchants.

The composition of the invention is used in a novel process wherein the gas etchant is introduced into the plasma etch reactor in order to etch one or more wafers situated therein having selectively exposed areas of tin oxide. During the etching phase of the process, the temperature is maintained at about or below 80° C. and a pressure in the reactor is maintained by an evacuator between 0.05 and 1.0 torr. In a preferred embodiment, the etching step of the process is preceded by a bombardment of the wafers with an argon discharge to make sure that the exposed tin oxide areas are cleaned of undesirable residues or an unwanted monolayers of contaminants such as water. Subsequent to the etching step, the wafers may be ashed with a combination oxygen and argon gas to remove the masking photoresist and to burn out polymer deposits.

BRIEF DESCRIPTION OF THE DRAWING

The invention and its advantages will be more thoroughly understood by referring to the following detailed description as taken in conjunction with the drawing, in which:

The FIGURE is a part-schematic, part-cross sectional view of a plasma reactor according to the invention.

DETAILED DESCRIPTION OF THE INVENTION

It has been discovered that chloroform ($CHCl_3$) gas produces a well-defined etch of tin oxide. However, the use of chloroform by itself as a gas or plasma etchant results in the undesirable accumulation of a yellow, carbon-based polymer on the reactor surfaces. The invention discloses methods and apparatus that may be used, either by themselves or in conjunction, to reduce the formation of this polymer by the chloroform gas. The invention thus enables the use of chloroform as a tin oxide etchant. The invention may also be employed to suppress polymer formation stemming from other carbon-based etchants such as fluorocarbons.

According to the invention, a minor proportion of an inorganic polymer suppressant including chlorine in its formula, such as elemental chlorine, boron trichloride ($BCl_3$), sulfur dichloride ($SCl_2$) or mixtures thereof, is added to the chloroform gas to produce a preferred etchant gas.

Where chlorine is selected as the polymer suppressant, it has been discovered that increasing the chlorine concentration relative to the chloroform will reduce the etch rate, but will stop the formation of the polymer deposited on the reactor surfaces. On the other hand, reduction of the chlorine concentration will increase the etch rate, but the formation of yellow polymer will become progressively less tolerable. In order to significantly suppress polymer formation and at the same time have an acceptable etch rate, the chlorine-chloroform composition of the invention has a molar ratio of chlorine to chloroform in the range from 0.001 to 0.1. A preferred molar ratio is in the range of 0.01 to 0.04, and an optimum, but not critical, relative molar concentration occurs at about 0.02.

A preferred polymer suppressant gas is boron trichloride. Boron trichloride is preferred over chlorine since it has the same advantages of etch regulation and polymer suppression, but attacks silicon dioxide structures less. Molar ratios of boron trichloride to chloroform that give satisfactory results range from 0.005 to 0.2. A more preferred range is 0.05 to 0.15. Optimum, although not critical, results are achieved at a [$BCl_3$]/[$CHCl_3$] molar ratio of about 0.08.

Referring to the FIGURE, the etching process according to the invention can be carried out in the apparatus indicated generally at 10. The apparatus includes a reactor 12, shown in elevational section. Reactor 12 is preferably of the radial type, and its major parts are circular, cylindrical or annular in shape. Reactor 12 is comprised of a top plate 14 that takes the form of a disc and an annular bottom plate 16. Top plate 14 and bottom plate 16 are formed of a refractory conductive material, such as aluminum. Aluminum itself is subject to attack from plasma etchants, but forms an aluminum oxide film that is impervious to such attack. Preferably, the aluminum parts of reactor 12 are anodized to increase the thickness of aluminum oxide for better protection.

Top plate 14 and bottom plate 16 are sealably joined by a cylindrical sidewall 18 that is also formed of anonized aluminum. Sidewall 18 can also be formed of a refractory insulative material such as quartz or glass, if an external conductive connection between top plate 14 and bottom plate is provided, such as a wire. Top plate 14 and bottom plate 16 are grounded.

A support 20 is disposed in the interior of reactor 12, and comprises a conductive annular member 22 joined to an upstanding member 24. A plurality of wafers W are arranged on annular member 22 preliminary to their being etched. Upstanding member 24 also defines an outlet into which the reactant gases are continually drawn. Upstanding member 24 makes a hermetic seal with lower plate 16.

Reactor 12 further includes a gas distribution manifold 26 with a plurality of orifices therein (not shown) for emitting the gas etchant into the reactor. Gas distribution manifold 26 is disposed beneath annular support member 22, such that the flow of the gas etchant proceeds radially from manifold 26 around the edges of annular member 22 and then exhausts down through upstanding member 24. A suitable connection is made from inlet manifold 26 to the exterior through tube 28.

As the gas etchant circulates across wafers W in the indicated manner, the gas etchant is turned into a plasma by means of RF cathode 30. Cathode 30 is preferably suspended above annular member 22, and is spaced therefrom by a small distance in the range of $\frac{1}{2}$ to $1\frac{1}{2}$ inches, preferably about one inch. RF cathode 30 is circular in shape and is coextensive with annular member 22. RF cathode 30 is electrically connected to a drive electrode 32, which in turn is connected to an RF matching network 40. RF electrode 32 ss insulated from top plate 14 by means of a feed-through insulator 33. Insulator 33 preferably has an interrupted surface as shown in order to increase the surface distance between electrode 32 and plate 14, thus decreasing the surface conductance across the insulator. RF cathode 30 is structurally suspended from top plate 14 by means of brackets 34 spaced about its periphery and insulators 36.

In order to suppress polymer formation from carbon-based etchants inside the reactor, a floating electrode 38 is disposed above and spaced from cathode 30. Without a floating electrode 30, a plasma discharge region is more likely to form in the middle of the space between RF cathode 30 and top plate 44. Upper and lower "dark spaces" will occur between the plasma discharge region and the top of RF cathode 30 on the one hand and the bottom of plate 14 on the other. Since the plasma discharge region itself is highly conductive, almost all of the potential between the grounded plate 14 and RF cathode 30 will occur across these "dark spaces." Electrons are accelerated in the "dark spaces" by the electric fields therein, until they attain sufficient velocity to ionize the reactant gas, creating the plasma discharge region. Yellow polymer will form as a byproduct of the ionized chloroform in the plasma discharge region.

This second plasma region is therefore undesirable, and may be suppressed as follows. The interposition of a floating electrode 38 midway between top plate 14 and RF cathode 30 causes the electric potential between conductors to be divided in two, onehalf between the floating electrode 38 and the RF cathode 30, and one-half between floating electrode 38 and plate 14. A plasma discharge region, supposing that the electric field is strong enough to make one, would be formed in the middle of each of these subdivided spaces, each plasma region having flanking "dark spaces." However, the available electric field in each "dark spaces" has been halved and is in most cases insufficient to generate the electron velocities needed to create a plasma discharge region.

Where RF generator 42 is set at a very high power rating, two or more floating electrodes can be equidistantly disposed between RF cathode 30 and plate 14, electrically subdividing the space therebetween into even smaller regions with correspondingly smaller electric fields, since the number of "dark spaces" is correspondingly increased.

Floating electrode 38 is preferably generally circular in shape and larger in diameter than cathode 30. A peripheral flange 45 extends downwardly to prevent the formation of a plasma discharge region between RF cathode 30 and sidewall 18. Insulators 36 are inserted through holes 41 formed in electrode 38 so as to be spaced therefrom. Likewise, drive electrode 32 is inserted through a hole 43 formed in electrode 38 to keep these structures insulated from each other. Floating electrode 38 is structurally suspended between cathode 30 and plate 14 by means of an insulator 37 and brackets 39.

Drive electrode 32 is electrically connected to a radio frequency matching network 40, which in turn is connected to a radio frequency source or generator 42. Radio frequency generator 42 is operable to generate a radio frequency signal having a selected power rating ranging from at least 300 to at least 1200 watts.

Conventional plasma reactors typically have their conductive components fabricated of stainless steel. It has been discovered that the use of chloroform or other carbon-based etchants in such reactors results in an unacceptable accumulation of carbon-based polymer on the reactor walls. Therefore, all stainless steel parts have been replaced with conductive components that are either formed of or faced with refractory materials such as aluminum. Polymer formation has been found to be reduced since all interior surfaces exposed to the etchant are then faced with refractory materials such as aluminum oxide, glass or quartz.

Apparatus 10 further includes a gas etchant source that is schematically illustrated and indicated generally at 44. Gas etchant source 44 preferably includes a source 46 of chloroform and a source 48 of a polymer suppressant gas such as boron trichloride, chlorine, sulfur dichloride or a mixture thereof. The suppressant can be in fact selected from any inorganic compound containing one or more chlorine atoms. The selected compound or compounds must however be either a gas or a liquid under ambient conditions, and must have a high enough vapor pressure that the vapor will not significantly condense in transport tubing or other apparatus disposed between the source 44 and the reactor 12. Sources 46 and 48 are respectively connected to flow meters 50 and 52, which can be Brooks flow meters. Flow meters 50 and 52 are operable to control the relative volumetric flows, and therefore the molar ratios, of the gas components. The outlets of flow meters 50 and 52 are both connected to a mixer 54, which mixes the gas components to produce the gas etchant of the invention. A gas line 56 connects the outlet of mixer 54 with tube 28. Suitable valves and gauges (not shown) are placed in the lines connecting the various components of gas etchant source 44.

The interior of reactor 12 is evacuated through member 24 by means such as blower 58 and mechanical pump 60. Blower 5S and pump 60 are operable to evacuate the interior of chamber reactor 12 to a pressure suitable for the formation of a radio frequency plasma discharge, such as 0.05 to 1.0 torr. Finally, a heater (not shown) is coupled to reactor 12 and is used to regulate the interior of reactor 12 to a temperature that preferably should not exceed 80° C.

The operation of apparatus 10 is as follows. A plurality of wafers W are arranged on support 22. Previously, wafers W have each had a uniform sheet of tin oxide deposited on their upper surfaces. This sheet of tin oxide has then been appropriately masked with photoresist to leave exposed areas of tin oxide. After the wafers W are placed therein, reactor 12 is closed and its interior evacuated to a pressure that can range from 0.05 to 1.0 torr. The preferred reactor pressure is about 0.15 torr where source 48 supplies boron trichloride, and is approximately 0.1 torr in the case of chlorine. If the pressure much exceeds 1.0 torr, the plasma discharge will be hard to maintain. On the other hand, if the pressure goes below approximately 0.05 torr, polymer formation is increased and the polymer may be resputtered on the etched areas.

Next, the preferred gas etchant composition of the invention is produced by mixer 54, and is introduced into the interior of reactor 12 by means of lines 56, tube 28 and manifold 26. Flow meters 50 and 52 are set such that a major proportion of chloroform is mixed with a minor proportion of the polymer suppressant gas. A satisfactory gas etchant can be produced that has a molar ratio of boron trichloride to chloroform of approximately 0.005 to 0.2, with preferred limits being about 0.05 to 0.15. An optimum boron trichloride/chloroform mixture was achieved at a molar ratio of about 0.08.

Likewise, a satisfactory gas etchant can be produced from a relative molar ratio of chlorine to chloroform of about 0.001 to 0.1, preferred limits being about 0.01 to 0.04. Optimum results were observed with a molar ratio of about 0.02.

The etchant composition should be introduced into the reactor at a flow of from $3.0 \times 10^{-5}$ to $1.5 \times 10^{-4}$ standard liters per minute of reactor volume assuming that the reactor volume is approximately 250 liters. The temperature inside the reactor should be maintained at or below 80° C., in order to avoid excessive formation of yellow polymer from the chloroform etchant.

Previous to this etching step, wafers W may be bombarded with argon in order to remove an adsorbed thin film residue formed on the exposed areas of tin oxide that are desired to be etched. This thin film residue results from stray photoresist molecules or other contaminants in the ambient atmosphere to which the wafers W are exposed previous to evacuation of reactor 12. This preliminary argon plasma discharge is preferably performed at a relatively low power setting for about 15 minutes. The power setting for the etching stage itself is preferably about 600 watts.

Etch rates on the order of 50 angstroms per minute are obtained under the above-described conditions. After the etching step itself, wafers W preferably undergo an ashing step wherein wafers W are bombarded with a combination of oxygen and argon at low pressure and 80° C. to remove the remaining photoresist and clean up any yellow polymer that may have formed.

EXAMPLE 1

The illustrated reactor was used to fabricate transparent tin oxide electrodes on a plurality of front-side illuminated CCD imagers. The imager wafers were placed on the annular support 22 and the interior of the reactor 12 was evacuated to approximately 0.12 torr. The temperature of the reactor was maintained at 80° C. and the power of the RF generator was set at 600 watts. The flow rate for the chloroform gas was set using a Brooks R-2-15-D flow meter tube with a spherical stainless steel 316 float at a setting of 150. Boron trichloride was used as the polymer suppressant gas, and was metered through a Brooks R-2-15-AAA flow meter tube with a spherical stainless steel float at a setting of 80. Previous to the etching, the imager slices were bombarded by an argon discharge at low pressure for at least 15 minutes. An etch rate of approximately 80 angstroms per minute was observed. After the etching step an oxygen-argon ashing step was employed to remove the photoresist and to burn out such deposits of the yellow polymer that formed. Relative to an etching step using chloroform by itself in a prior art reactor without a floating electrode and stainless steel parts, formation of yellow polymer was much reduced.

Good uniformity of the produced CCD imager slices was obtained.

EXAMPLE 2

In this example the polymer suppressant gas used was chlorine. The power of the radio frequency generator was set at 600 watts, and the temperature of the reactor was regulated to about 80° C. The pressure inside the reactor chamber was regulated to about 0.1 torr. A Brooks R-2-15-D flow meter was used to regulate the chloroform gas, and a Brooks R-2-15-AAA flow meter with a glass ball was used to meter the flow of the chlorine gas. An etch rate of about 40 angstroms per minute was observed. Good uniformity in the resultant CCD imagers was obtained.

ADVANTAGES OF THE INVENTION

A principal advantage of the invention is the provision of a plasma etchant composition that can be used in producing high-quality, high-resolution CCD imagers or other semiconductor devices having tin oxide electrodes. A further advantage is the provision of a gas etchant composition including a major proportion of chloroform and a minor proportion of an inorganic chlorine-containing polymer suppressant, such that polymer formation inside the reactor chamber is reduced to acceptable levels. A further advantage is provided by the provision of a floating electrode inside the reactor chamber, which further reduces polymer formation by inhibiting the formation of unwanted plasma discharge regions. Yet another advantage stems from the provision of refractory components, such as aluminum, glass and quartz, for the reactor components that further discourages polymer formation. Yet another advantage is the provision of a range of pressures and temperatures under which an excellent plasma etch can be accomplished without polymer resputtering or plasma discharge failure. Yet another advantage is provided by a preliminary argon bombardment step in order to clear photoresist or other absorbed residue off the exposed areas of tin oxide to be etched. Another advantage is provided by a subsequent ashing step whereby the photoresist and unwanted polymer is removed.

While preferred embodiments of the invention and the advantages inherent therein have been described in detail, the invention is not limited thereto but only by the spirit and scope of the appended claims.

What is claimed is:

1. A process for etching a tin oxide structure on a surface, comprising the step of subjecting exposed areas of tin oxide to a gas phase etchant formed from a major proportion of chloroform and a minor proportion of a polymer suppressant selected from the group consisting of inorganic compounds including at least one chlorine atom, said inorganic compounds being liquid or gas, and having a high vapor pressure, under ambient conditions.

2. The process of claim 1, wherein the polymer suppressant is selected from the group consisting of chlorine, boron trichloride, sulfur dichloride and mixtures thereof.

3. The process of claim 2, wherein the polymer suppressant is comprised of chlorine.

4. The process of claim 3, and further including the step of mixing chlorine and chloroform in a molar ratio in the range of about 0.001 to about 0.1 in order to form the etchant.

5. The process of claim 2, wherein the polymer suppressant is comprised of boron trichloride.

6. The process of claim 5, and further including the step of mixing boron trichloride and chloroform in a molar ratio in a range of about 0.005 to about 0.2 to form the etchant.

7. The process of claim 1, and further including the steps of:
ionizing the etchant to form a plasma etchant; and
maintaining the pressure of the plasma etchant in a range from 0.05 to 1.0 torr during the step of subjecting the exposed areas of tin oxide to the etchant.

8. A process for selectively removing tin oxide from a surface, comprising the steps of:
forming a sheet of tin oxide on the surface;
selectively forming a mask on the sheet to define a plurality of exposed areas of tin oxide;
forming a gas etchant from a major proportion of chloroform gas and a minor proportion of a gas selected from the group consisting of inorganic compounds having at least one chlorine atom, the compounds being liquids or gases and having a high vapor pressure under ambient conditions;
ionizing the gas etchant to produce a plasma; and
etching the exposed areas with the plasma.

9. The process of claim 8, and further including the step of:
bombarding the exposed areas of tin oxide with an inert gas prior to the step of etching the exposed areas in order to remove undesirable thin film residues from the exposed areas.

10. The process of claim 9, wherein the inert gas comprises argon.

11. The process of claim 8, and further including the step of:
ashing the surface subsequent to etching the exposed areas in order to remove the mask and any carbon-based polymer formed during the step of etching the exposed areas.

12. The process of claim 11, wherein the step of ashing further includes the step of subjecting the surface to an ashing composition comprising oxygen and argon.

13. The process of claim 8, and further including the steps of:
placing the surface inside a reactor vessel; and
maintaining a low pressure inside the reactor vessel ranging from about 0.05 to about 1.0 torr.

14. The process of claim 13, wherein the pressure is maintained at about 0.15 torr.

15. The process of claim 13, wherein said vessel further includes a cathode for generating a radio frequency discharge, the process further including the step of:
coupling a radio frequency generator to the cathode; and
maintaining the power of the generator at a selected value between 300 and 1200 watts.

16. The process of claim 15, wherein the power is maintained at about 600 watts.

17. The process of claim 13, and further including the step of:
maintaining a temperature not exceeding about 80° C. inside the vessel during the step of etching the exposed areas.

18. The process of claim 13, and further including the step of flowing the gas etchant through the reactor at a selected flow in the range of $1.2 \times 10^{-7}$ to $6.0 \times 10^{-7}$ standard liters per minute per liter of reactor volume.

19. The process of claim 8, and further including the step of forming the gas etchant from a major proportion of chloroform gas and a minor proportion of a suppressant selected from the group consisting of chlorine, boron trichloride, sulfur dichloride and mixtures thereof.

20. The process of claim 19, and further including the step of forming the gas etchant from a major proportion of chloroform gas and a minor proportion of boron trichloride.

21. The process of claim 19, and further including the step of forming the gas etchant from a major proportion of chloroform gas and a minor proportion of chlorine.

* * * * *